United States Patent [19]
Mand et al.

[11] Patent Number: 5,491,711
[45] Date of Patent: Feb. 13, 1996

[54] SEMICONDUCTOR LASER DEVICE

[75] Inventors: Ranjit S. Mand, San Jose, Calif.; Tetsuro Ijichi, Yokohama, Japan; Jingming Xu, Oakville, Canada

[73] Assignee: The Furukawa Electric Co., Ltd., Tokyo, Japan

[21] Appl. No.: 145,835

[22] Filed: Nov. 4, 1993

[51] Int. Cl.$^6$ ........................................ H01S 3/19
[52] U.S. Cl. ........................................ 372/49
[58] Field of Search ........................ 372/49; 257/98

[56] References Cited

U.S. PATENT DOCUMENTS 5,022,037  6/1991  Kawanishi et al. ................. 372/49

*Primary Examiner*—James W. Davie
*Attorney, Agent, or Firm*—Jacobson, Price, Holman & Stern

[57] ABSTRACT

A semiconductor laser device having a body with opposed facets and including an active region with aluminum diffused into the active region along the facets thereof. Adding aluminum to the portions of the active region along the facets increases the bandgap of the active region along the facets and provides a semiconductor laser device having an increased catastrophic optical damage (COD) level. The semiconductor laser device is produced by depositing a thin film of aluminum on the facets of the semiconductor laser device and then heat treating to cause diffusion of the aluminum film or phosphorus into the body of the semiconductor laser device along the facets thereof, thereby changing the composition of the semiconductor laser device body along the facets. Alternatively, phosphorus may be diffused into the body of the semiconductor laser device along the facets thereof.

2 Claims, 2 Drawing Sheets surface facet facet

SEMICONDUCTOR LASER DEVICE

BACKGROUND OF THE INVENTION

1. Field of the Invention

This invention relates to a semiconductor laser device useful in the fields of optical telecommunication, optical amplification and optical instrumentation as a source of light having a wavelength in a band between about 0.9 and 1.6 µm, more specifically between 0.98 and 1.55 µm, and to a method of making such a semiconductor laser device.

2. Description of the Related Art

One of the biggest problems, from the reliability point of view, with semiconductor laser devices, particularly 0.98 µm laser diodes, is that they have low catastrophic optical damage COD levels. COD is destruction due to light absorption at the laser facet or surface. The exact mechanism of COD is not well understood, but it is generally accepted to be as follows:

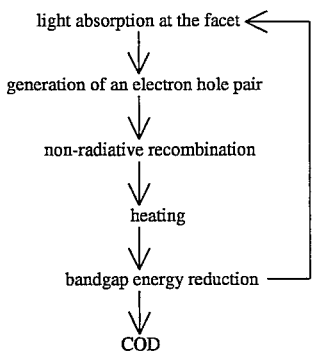

However, the question remains as to how light absorption starts at the facet in the first place. A normal semiconductor has energy bands bending at the surface as shown in FIG. 1. Using a strain layer InGaAs lattice matched to a GaAs semiconductor substrate will provide a stress relief at the facet, which probably gives rise to bandgap narrowing at the facet as shown in FIG. 2. That is, in the bulk the strain is biaxial and at the facet the strain becomes uniaxial causing bandgap narrowing. Therefore, adding the two effects together the bandgap near the facet becomes as shown in FIG. 3, i.e., $Eg_2 > Eg_1$. Such an effect should give rise to considerable increase in light absorption and, according to the COD mechanism shown above, will cause the COD level to decrease considerably.

Several ways have been proposed to overcome the problem of COD, including:

(a) re-growth of wideband material such as AlGaAs on a GaAs/InGaAs/AlGaAs laser device, which has been called a "window structure;"

(b) coating the facet with $Al_2O_3$ where $Al_2O_3$ has a higher thermal conductivity than $SiO_2$;

(c) making a current blocking structure at the facet, in which no current is injected near the facet region;

(d) making a bent waveguide in which the light from one facet comes out from a clad layer instead of the active region;

(e) making a flare structure, in which the beam coming out from one facet spreads to give lower optical density at the facet; and (f) making a window structure in which zinc is used to create a window.

However, semiconductor laser devices made by each of these methods suffers from significant manufacturing and/or use shortcomings. Method (a) is tedious, and it is difficult and expensive to produce a laser device by this method. Method (b) does not completely get rid of the COD problem, although it is an improvement over laser devices using $SiO_2/Si$ facet coatings. Method (c) works up to a point in that COD level becomes high before burn-in, however, the COD level undesirably comes down after burn-in. Method (d) is difficult to practice reproducibly. Method (e) also works up to a point in that the COD level is high before burn-in but comes down after burn-in. However, method (e) is better than method (c). Method (f) seems to be the most successful from the viewpoint of long term reliability, but it cannot be used for an InGaAs/GaAs/InGaP material system laser device as In from InGaP gets kicked out into InGaAs on diffusion of zinc.

Of all the methods listed above, only method (f) makes a physical change in the composition of the semiconductor laser device material layers; the rest of the methods simply make geometrical changes to the laser device structure. It must be noted that in methods (a) and (f) a facet "window" is created, but differently. In method (a), the as-grown active region remains and the window (AlGaAs) is grown on the facet. In method (f), the window at the facet is created by zinc diffusion into the active region to cause its bandgap to decrease except near the facet where the bandgap remains as it was grown.

SUMMARY OF THE INVENTION

The present invention provides an improved semiconductor laser device having a significantly higher COD level than prior semiconductor laser devices. The invention also provides a simple, straightforward method for producing semiconductor laser devices having a high COD level.

The semiconductor laser device of the present invention has a "window" at each of the facets of the laser device, each window is a region of increased bandgap as compared to the active region of the remainder of the semiconductor laser device. The window at each facet is created by depositing a material in thin film form on both facets of the semiconductor laser device, and then heat treating the laser device to cause diffusion of this thin film material into the facet. This causes the bandgap of the active region of the laser device to increase at both facets, thereby significantly raising the COD level and overcoming the problems and disadvantages of prior semiconductor laser devices.

It is an object of the present invention to provide an improved semiconductor laser device which does not suffer from the disadvantages of prior laser devices.

It is a further object of the invention to provide a semiconductor laser device having an increased COD level as compared to prior laser devices.

It is a still further object of the invention to provide a semiconductor laser device having improved reliability.

Another object of the present invention is to provide a simple and straightforward method for producing a semiconductor laser device having a high COD level.

These and other objects and advantages of the present invention will be further understood by reference to the following detailed description and drawings, wherein:

DETAILED DESCRIPTION OF THE INVENTION

Figure 1:
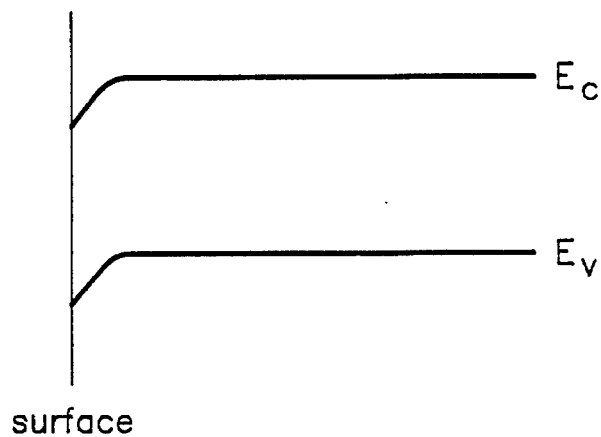
FIG. 1 illustrates the bandgap at the surface of a normal semiconductor material.
Figure 2:
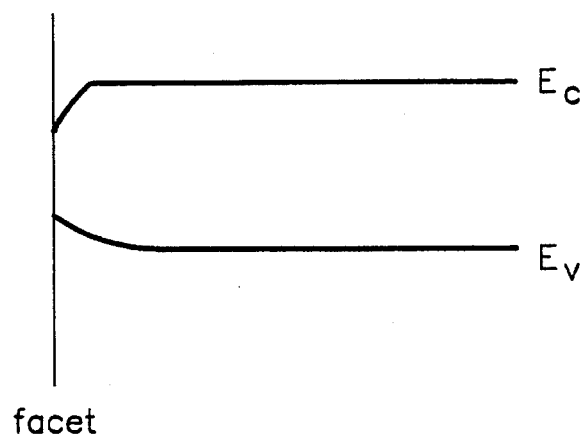
FIG. 2 illustrates the bandgap at the facet of an InGaAs strain layer provided on a GaAs semiconductor substrate for strain relief.
Figure 3:
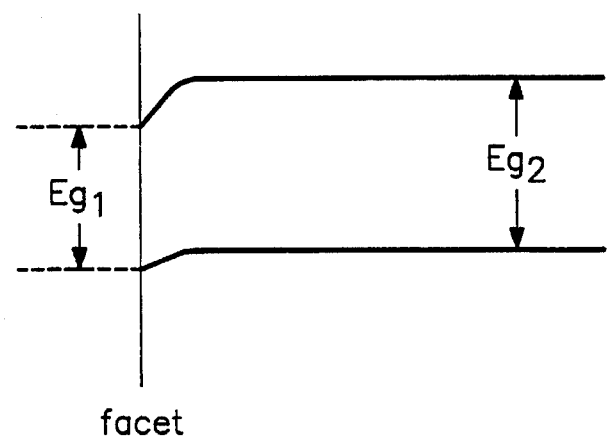
FIG. 3 illustrates the additive effect on the bandgap of providing the InGaAs strain layer on the GaAs semiconductor substrate.

The semiconductor laser device of the present invention and the method of making the same will now be described with reference to the drawing figures and to one specific embodiment of a semiconductor laser device. This description refers to one preferred embodiment of the invention, but it is to be understood that the invention is not limited to this specific embodiment.

Figure 4:
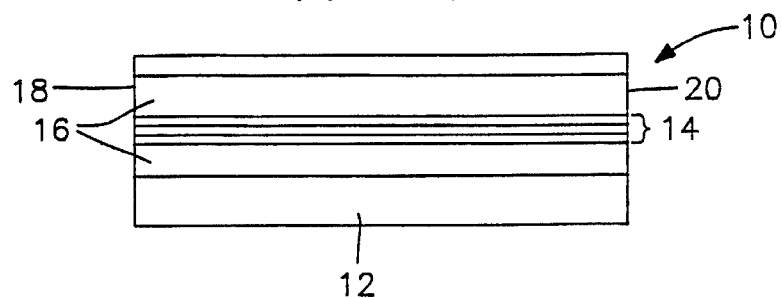
FIG. 4 is a cross-sectional view of a conventional semiconductor laser device.
Figure 7:
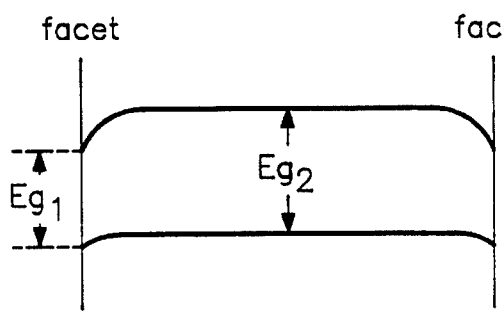
FIG. 7 shows the laser device active region band structure for the conventional semiconductor laser device of FIG. 4.

FIG. 4 shows, in cross section, a conventional semiconductor laser device 10 comprising an InGaAs/GaAs/InGaP material system. Laser device 10 comprises a GaAs semiconductor substrate 12, an InGaAs/GaAs active layer 14, and InGaP clad layers 16. The conventional laser device 10 has opposed facets 18, 20 and the laser device active region band structure between facets 18, 20 for laser device 10 is shown in FIG. 7. As can be seen in FIG. 7, $Eg_2$, the bandgap through the body of the active region, is greater than $Eg_1$, the bandgap at the facets of the active region of the laser device. This leads to COD as described above.

Figure 5:
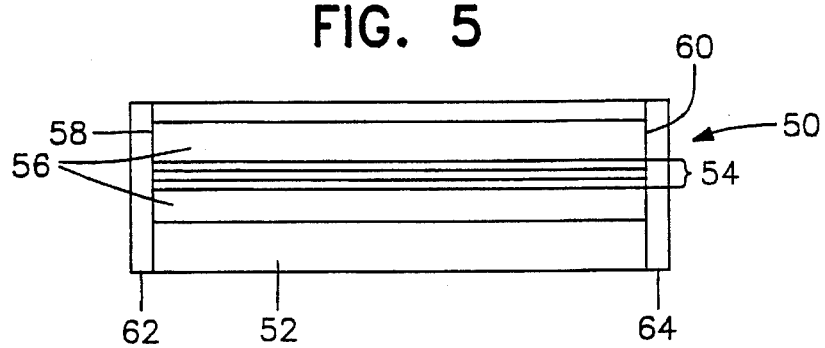
FIG. 5 is a cross-sectional view of a semiconductor laser device having an aluminum coating applied to the facets thereof according to the present invention.
Figure 6:
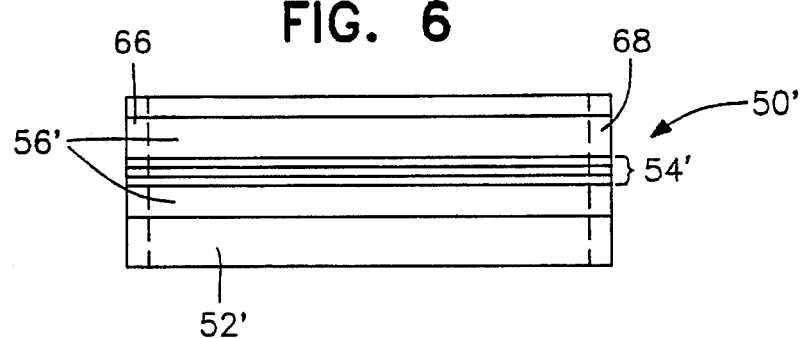
FIG. 6 is a cross-sectional view of a semiconductor laser device having the aluminum coating diffused into the laser device at the facets thereof.

Referring now to FIGS. 5 and 6, there is shown a semiconductor laser device produced in accordance with the present invention. FIG. 5 shows a conventional InGaAs/GaAs/InGaP semiconductor laser device 50 having a GaAs semiconductor substrate 52, an InGaAs/GaAs active layer 54, and InGaP clad layers 56.

Figure 8:
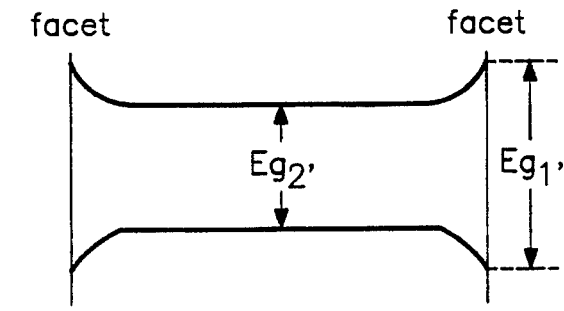
FIG. 8 shows the laser device active region band structure for the semiconductor laser device of FIG. 6 in accordance with the present invention.

In accordance with the present invention, a thin film 62, 64 of aluminum, preferably having a thickness of between about 5 Å and 50 Å, is applied to the opposed facets 58, 60 of the semiconductor laser device 50. The laser device 50 having the thin film coating 62, 64 on the facets 58, 60 thereof is heat treated to cause the aluminum from thin film coating 62, 64 to diffuse into the laser device 50 thereby changing the composition of the laser device material from InGaAs/GaAs/InGaP to AlInGaAs/AlGaAs/AlInGaP at the facets thereof. The laser device 50' having the aluminum diffused into the material thereof is shown in FIG. 6, in which 52' is the GaAs semiconductor substrate, 54' is the InGaAs/GaAs active layer, 56' are the InGaP clad layers and the facet areas having the changed composition are indicated at 66, 68. The most important result of this process of the invention is that at the facets, the active region material InGaAs changes to the wider bandgap material AlInGaAs. Thus, a window structure laser device is created which exhibits the active region band structure shown in FIG. 8. As seen there, $Eg_2'$, the bandgap through the body of the active region of the laser device of the present invention, is less than $Eg_1'$, the bandgap at the facets of the active region of the inventive laser device. This prevents COD and provides an improved semiconductor laser device having a higher COD level than laser devices of the prior art.

As mentioned above, the semiconductor laser device having a thin film of aluminum deposited on the facets thereof is subjected to a heat treatment to cause diffusion of the aluminum into the facets of the laser device. One suitable heat treatment is rapid thermal annealing at 800° C. for 10 seconds to cause diffusion of the aluminum about 500 Å into the facet. Of course, other variations to this specific rapid thermal annealing process can be made and other types of heat treatment may be employed so long as the heat treatment used is effective to cause diffusion of the aluminum film about 500 to 1,000 Å into the facets of the semiconductor laser device.

Because aluminum is subject to oxidation, it may be desirable, but not required, to provide an anti-reflective/high-reflective coating of $SiO_2$ over the aluminum film before the heat treatment. Such a protective coating of $SiO_2$ can be deposited over the aluminum film on the facets by any suitable means known to those in the art, and is preferably deposited at a thickness of not greater than about 1,000 Å.

Although the invention has been described with reference to a preferred embodiment and example thereof, it is not intended that the present invention be limited to only the described embodiment. For example, the present invention is applicable to semiconductor laser devices other than those employing an InGaAs/GaAs/InGaP material system, and more specifically to all high power laser devices, e.g., 0.098 μm InGaAs/GaAs/AlGaAs and 1.55 100 MWMQW DFB made by NEC. Also, a phosphosilicate glass may be formed on the facets as a thin film by simultaneous pyrolysis of silane and phosphine in oxygen in a temperature range of 300° to 450° C. and then subjected to a heat treatment such as rapid thermal annealing at 700° C. for a few seconds to cause the phosphorus to diffuse into the facets. Thus, the description of the preferred embodiment contained herein is intended in no way to limit the scope of the invention. As will be apparent to a person skilled in the art, modifications and adaptations of the above-described invention will become readily apparent without departure from the spirit and scope of the invention, the scope of which is defined and circumscribed by the appended claims.

What is claimed is:

1. A semiconductor laser device comprising a body having opposed facets, said body comprising an InGaAs/GaAs active region with portions of said active region along said facets having a thin film material of aluminum or phosphorus diffused therein.

2. The device of claim 1, wherein the thin film material is aluminum.

* * * * *